United States Patent
Lee

(10) Patent No.: US 11,862,461 B2
(45) Date of Patent: Jan. 2, 2024

(54) METHOD OF FORMING OXIDE LAYER ON A DOPED SUBSTRATE USING NITRIDATION AND OXIDATION PROCESS

(71) Applicant: CHANGXIN MEMORY TECHNOLOGIES, INC., Hefei (CN)

(72) Inventor: Tzung-Han Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/851,645

(22) Filed: Jun. 28, 2022

(65) Prior Publication Data

US 2023/0207315 A1 Jun. 29, 2023

Related U.S. Application Data

(63) Continuation of application No. PCT/CN2022/088464, filed on Apr. 22, 2022.

(30) Foreign Application Priority Data

Dec. 28, 2021 (CN) .......................... 202111625986.8

(51) Int. Cl.
*H01L 21/02* (2006.01)
*H01L 21/308* (2006.01)

(52) U.S. Cl.
CPC .. *H01L 21/02614* (2013.01); *H01L 21/02236* (2013.01); *H01L 21/02247* (2013.01); *H01L 21/02252* (2013.01); *H01L 21/02532* (2013.01); *H01L 21/3083* (2013.01)

(58) Field of Classification Search
CPC ......... H01L 21/02614; H01L 21/02247; H01L 21/02252; H01L 21/02236; H01L 21/02532; H01L 21/3083
See application file for complete search history.

(56) References Cited

U.S. PATENT DOCUMENTS

| | | | |
|---|---|---|---|
| 6,773,999 B2 | 8/2004 | Yoneda | |
| 7,164,178 B2 | 1/2007 | Yoneda | |
| 7,563,726 B2 | 7/2009 | Cho | |
| 8,361,852 B2 | 1/2013 | Jeong | |
| 9,620,479 B1 * | 4/2017 | Edelstein | ............ H01L 23/5228 |
| 10,157,932 B2 | 12/2018 | Watanabe | |

(Continued)

FOREIGN PATENT DOCUMENTS

| | | |
|---|---|---|
| CN | 1398005 A | 2/2003 |
| CN | 1770402 A | 5/2006 |

(Continued)

*Primary Examiner* — Mark W Tornow
*Assistant Examiner* — David Paul Sedorook
(74) *Attorney, Agent, or Firm* — Cooper Legal Group, LLC

(57) ABSTRACT

A semiconductor structure and a method for forming a semiconductor structure are provided. The method includes: a base is provided, in which the base includes a first doped area and a second doped area, and an isolation structure is provided between the first doped area and the second doped area; nitridation treatment is performed on the first doped area and the second doped area; and oxidation treatment is performed on the first doped area and the second doped area subjected to the nitridation treatment, to form a first gate oxide layer and a second gate oxide layer respectively.

11 Claims, 17 Drawing Sheets

(56) References Cited

U.S. PATENT DOCUMENTS

| | | | |
|---|---|---|---|
| 2002/0119628 A1* | 8/2002 | Lai | H01L 21/76224 |
| | | | 257/E21.546 |
| 2003/0015763 A1 | 1/2003 | Yoneda | |
| 2003/0157771 A1* | 8/2003 | Luoh | H01L 21/02326 |
| | | | 438/771 |
| 2004/0232516 A1 | 11/2004 | Yoneda | |
| 2006/0138550 A1 | 6/2006 | Cho | |
| 2006/0237784 A1* | 10/2006 | Rahim | H01L 27/0922 |
| | | | 257/E27.11 |
| 2006/0246647 A1* | 11/2006 | Visokay | H01L 21/823857 |
| | | | 257/E21.639 |
| 2007/0063273 A1 | 3/2007 | Yoneda | |
| 2007/0122752 A1* | 5/2007 | Asako | H01L 21/76814 |
| | | | 430/313 |
| 2010/0013022 A1 | 1/2010 | Heung-Jae | |
| 2011/0117714 A1* | 5/2011 | Levy | H01L 21/76229 |
| | | | 257/E21.546 |
| 2011/0207273 A1 | 8/2011 | Jeong | |
| 2012/0295429 A1* | 11/2012 | Kawamoto | H01L 21/67034 |
| | | | 257/E21.346 |
| 2016/0300756 A1* | 10/2016 | Somervell | H01L 21/02164 |
| 2018/0047745 A1 | 2/2018 | Watanabe et al. | |
| 2019/0006171 A1* | 1/2019 | Dasgupta | H01L 21/02381 |
| 2020/0091157 A1* | 3/2020 | Nakatsuji | H01L 21/823462 |

FOREIGN PATENT DOCUMENTS

| | | | | |
|---|---|---|---|---|
| CN | 1797769 A | | 7/2006 | |
| CN | 101393861 A | | 3/2009 | |
| CN | 102054678 A | | 5/2011 | |
| CN | 102163619 A | | 8/2011 | |
| CN | 102479712 A | | 5/2012 | |
| CN | 103903986 A | | 7/2014 | |
| CN | 106876274 A | * | 6/2017 | H01L 21/336 |
| CN | 113345834 A | | 9/2021 | |
| CN | 115588607 A | * | 1/2023 | H01L 21/02 |
| WO | 2012071986 A1 | | 6/2012 | |

* cited by examiner

METHOD OF FORMING OXIDE LAYER ON A DOPED SUBSTRATE USING NITRIDATION AND OXIDATION PROCESS

CROSS-REFERENCE TO RELATED APPLICATIONS

The disclosure is a continuation application of International Patent Application No. PCT/CN2022/088464, filed on Apr. 22, 2022, which claims priority to Chinese Patent Application No. 202111625986.8, filed on Dec. 28, 2021, and entitled "SEMICONDUCTOR STRUCTURE AND METHOD FOR FORMING SEMICONDUCTOR STRUCTURE". The disclosures of International Patent Application No. PCT/CN2022/088464 and Chinese Patent Application No. 202111625986.8 are hereby incorporated by reference in their entireties.

BACKGROUND

In related art, under the same gate oxide process conditions, there are often some differences in thickness of gate oxide layers formed on different doped areas. The differences in thickness of the gate oxide layers may affect electrical parameters and/or electrical properties of semiconductor devices.

SUMMARY

The disclosure relates to, but is not limited to, a semiconductor structure and a method for forming a semiconductor structure.

In view of the above, embodiments of the disclosure provide a semiconductor structure and a method for forming a semiconductor structure.

In a first aspect, the embodiments of the disclosure provide a method for forming a semiconductor structure, including the following operations. A base is provided, in which the base includes a first doped area and a second doped area, and an isolation structure is provided between the first doped area and the second doped area. Nitridation treatment is performed on the first doped area and the second doped area. Oxidation treatment is performed on the first doped area and the second doped area subjected to the nitridation treatment, to form a first gate oxide layer and a second gate oxide layer respectively.

In a second aspect, the embodiments of the disclosure provide a semiconductor structure, which is formed by the method as described above.

BRIEF DESCRIPTION OF THE DRAWINGS

In the drawings (which are not necessarily drawn to scale), similar reference numerals may denote similar components in different figures. The similar reference numerals having different letter suffixes may denote different examples of the similar components. The drawings generally illustrate various embodiments discussed in the disclosure by way of example and not by way of limitation.

DETAILED DESCRIPTION

Figure 1A:
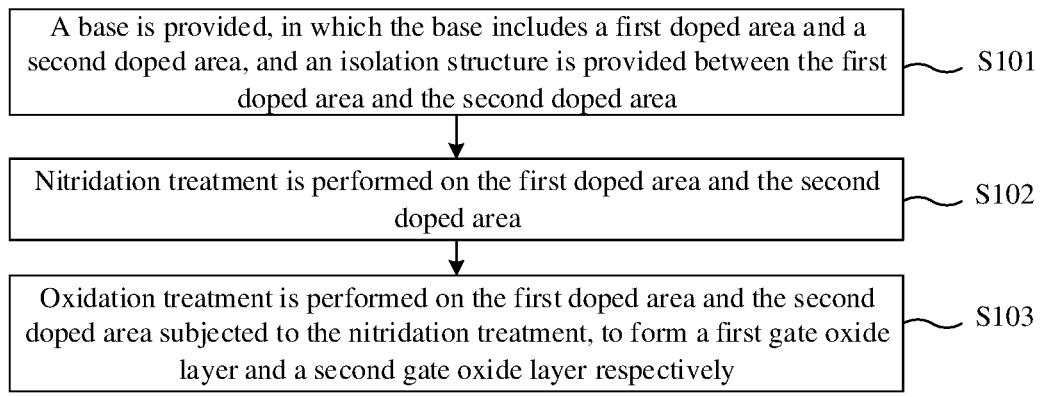
FIG. 1A is a schematic flowchart of a method for forming a semiconductor structure according to an embodiment of the disclosure.

With reference to the accompanying drawings, the following further describes exemplary implementations disclosed in the disclosure in detail. Although the accompanying drawings illustrate the exemplary implementations of the disclosure, it should be understood that the disclosure can be implemented in multiple forms, and should not be limited by the particular implementations described here. On the contrary, the purpose of providing these implementations is to more thoroughly understand the disclosure, and the scope of the disclosure is fully conveyed to persons skilled in the art.

In the following description, numerous specific details are given in order to provide a more thorough understanding of the disclosure. However, it is apparent to persons skilled in the art that the disclosure may be implemented without one or more of these details. In other examples, in order to avoid confusion with the disclosure, some technical features well known in the art are not described. That is, all the features of the actual embodiments are not described herein, and well-known functions and structures are not described in detail.

In the accompanying drawings, for clarity, the dimensions of layers, areas, elements and their relative dimensions may be exaggerated. The same reference numerals are used to denote the same components throughout the disclosure.

It should be understood that when an element or layer is referred to as being "on", "adjacent to", "connected to" or "coupled to" another element or layer, it can be directly on, adjacent to, connected to or coupled to the another element or layer, or intervening elements or layers may be present. In contrast, when an element is referred to as being "directly on", "directly adjacent to", "directly connected to" or "directly coupled to" another element or layer, there are no intervening elements or layers. It should be understood that though the terms, first, second, third, etc., are used to describe the elements, components, areas, layers and/or sections, those elements, components, areas, layers and/or sections should not be limited by these terms. The terms are merely used to distinguish one element, component, area, layer or section from another element, component, area, layer or section. Thus, a first element, component, area, layer or section, which is discussed below, may be referred to as a second element, component, area, layer or section, without departing from the scope of the disclosure. Moreover, when a second element, component, area, layer or section is discussed, it does not mean that a first element, component, area, layer or section is necessarily present in the disclosure.

The terms used herein are for the purpose of describing particular embodiments only and is not intended to limit the disclosure. As used herein, the singular forms "a", "an" and "the/said" are intended to include the plural forms as well, unless the context clearly indicates otherwise. It should be further understood that the terms "consisting of" and/or "include", when used in this description, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of the associated listed items.

The embodiments of the disclosure provide a method for forming a semiconductor structure, as shown in FIG. 1A, including S101 to S103.

At S101, a base is provided, in which the base includes a first doped area and a second doped area, and an isolation structure is provided between the first doped area and the second doped area.

Figure 1B:
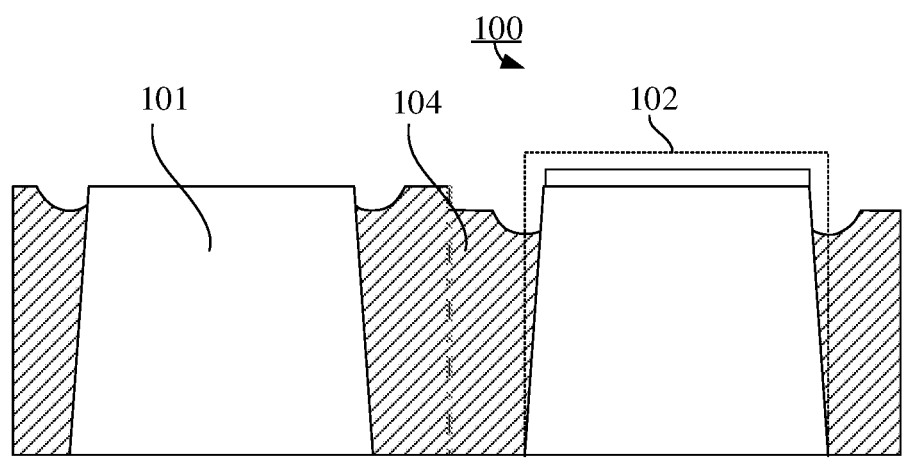
FIG. 1B is a schematic diagram of a process for forming a semiconductor structure according to an embodiment of the disclosure.

With reference to FIG. 1B, a base 100 includes a first doped area 101 and a second doped area 102, and an isolation structure 104 is provided between the first doped area 101 and the second doped area 102.

Figure 2A:
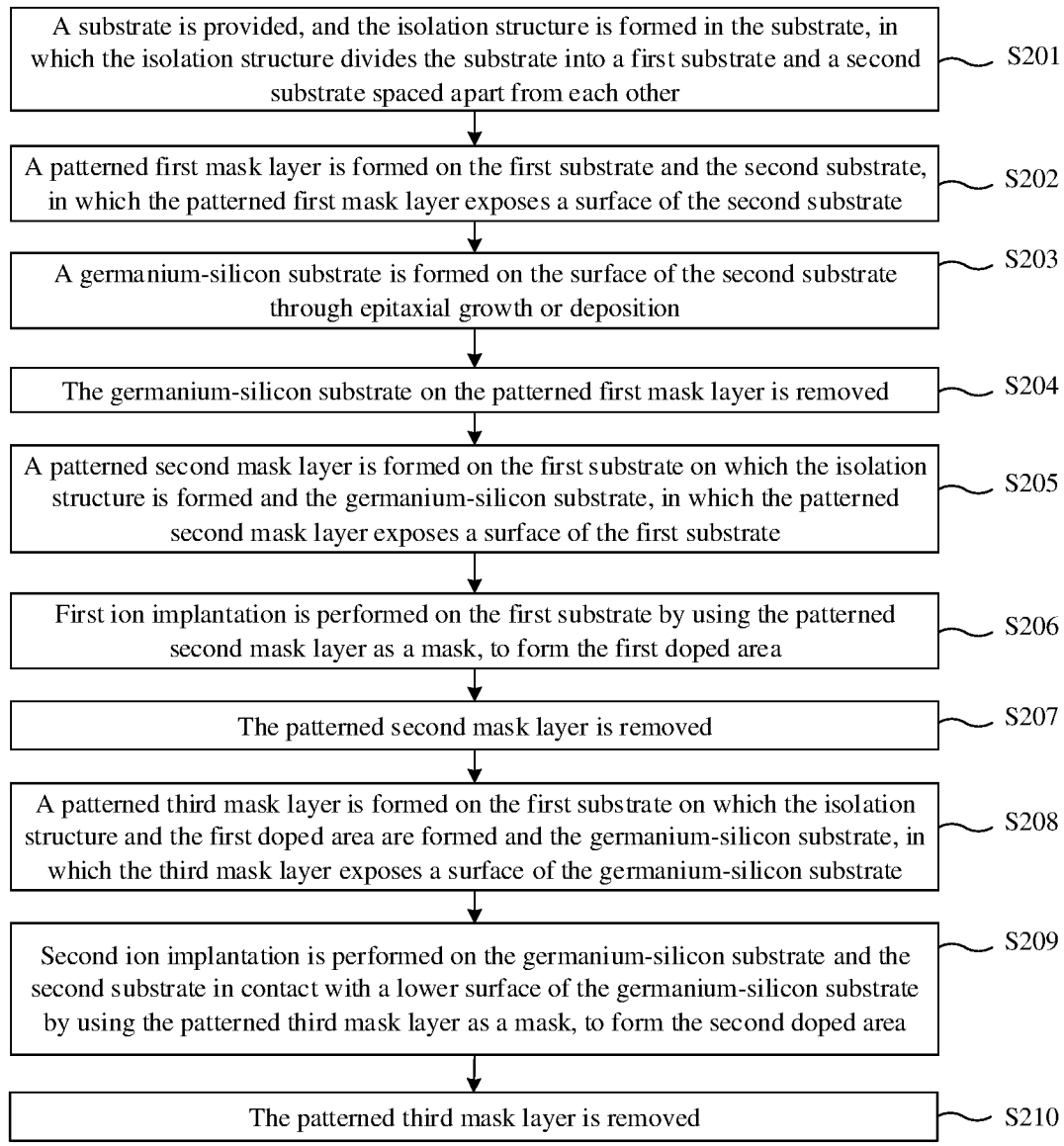
FIG. 2A is a schematic flowchart of a method for forming a base according to an embodiment of the disclosure.

In some embodiments, the isolation structure is formed on a substrate, and the substrate on which the isolation structure is formed is doped, to form the first doped area on one side of the isolation structure and to form the second doped area on another side of the isolation structure to form the base. This operation may include S201 to S210, as shown in FIG. 2A. The operations of forming the base are described below with reference to FIG. 2B to FIG. 2H.

Figure 2B:
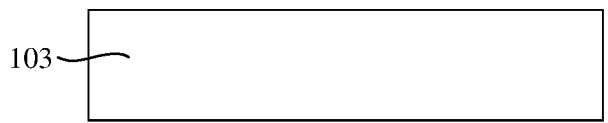
FIG. 2B to FIG. 2J are schematic diagrams of a process for forming a semiconductor structure according to an embodiment of the disclosure.
Figure 2C:
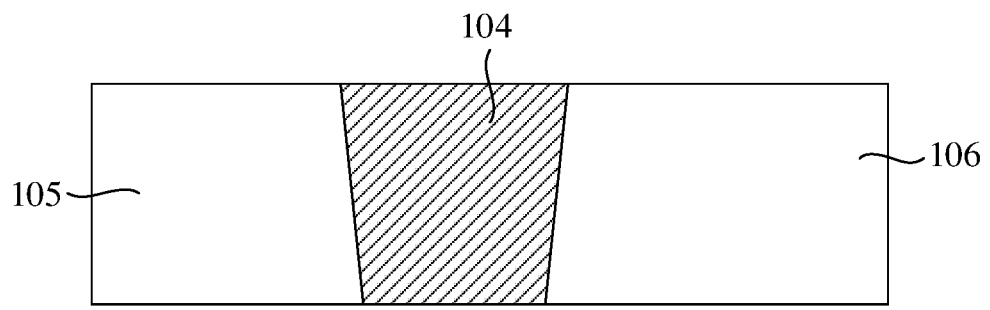

At S201, a substrate 103 is provided, as shown in FIG. 2B; the isolation structure 104 is formed in the substrate 103, in which the isolation structure 104 divides the substrate 103 into a first substrate 105 and a second substrate 106 spaced apart from each other, i.e., the isolation structure 104 is provided between the first substrate 105 and the second substrate 106, as shown in FIG. 2C. In some embodiments, the substrate may be a silicon substrate, a silicon on insulator substrate and the like. The substrate may also include other semiconductor elements, or include semiconductor compounds such as silicon carbide (SiC), gallium arsenide (GaAs), gallium phosphide (GaP), indium phosphide (InP), indium arsenide (InAs) or indium antimonide (InSb), or include other semiconductor alloys such as gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or a combination thereof.

The isolation structure may include a Shallow Trench Isolation (STI) structure or a Local Oxidation of Silicon (LOCOS) isolation structure, which is not limited here. The material of the isolation structure may include one or more of oxide of silicon, such as silicon oxide or silicon oxynitride. The isolation structure can be formed by a Chemical Vapor Deposition (CVD) process, a Physical Vapor Deposition (PVD) process, an Atomic Layer Deposition (ALD) process or the like.

At S202, a patterned first mask layer is formed on the first substrate and the second substrate, in which the patterned first mask layer exposes a surface of the second substrate.

Figure 2D:
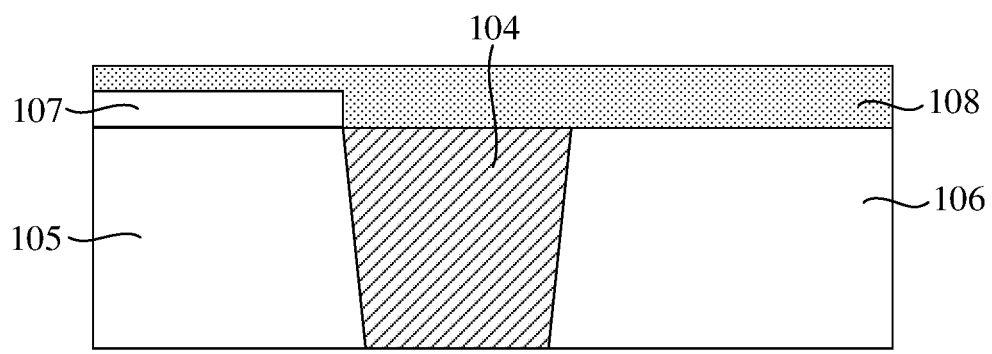

With reference to FIG. 2D, a patterned first mask layer 107 is formed on the first substrate 105 and the second substrate 106. The patterned first mask layer 107 exposes the second substrate 106.

In some embodiments, the material of the patterned first mask layer 107 may include oxide of silicon, oxide of nitrogen or carbide such as silicon oxide, silicon nitride, silicon carbide, or silicon oxynitride. In addition, the patterned first mask layer 107 can be formed by any of deposition processes such as chemical vapor deposition, physical vapor deposition and atomic layer deposition, and the patterned first mask layer 107 can be formed by photolithography, dry or wet etching.

At S203, a germanium-silicon substrate is formed on the surface of the second substrate through epitaxial growth or deposition.

With reference to FIG. 2D, a germanium-silicon substrate 108 is formed on the surface of the second substrate 106 through epitaxial growth or deposition. During implementation, the germanium-silicon substrate 108 may also be formed on the patterned first mask layer 107, and the deposition process may be chemical vapor deposition. Forming the germanium-silicon substrate 108 on the second substrate 106 can effectively increase the migration rate of a hole, thereby improving the turn-on speed of the device.

At S204, the germanium-silicon substrate on the patterned first mask layer is removed.

Figure 2E:
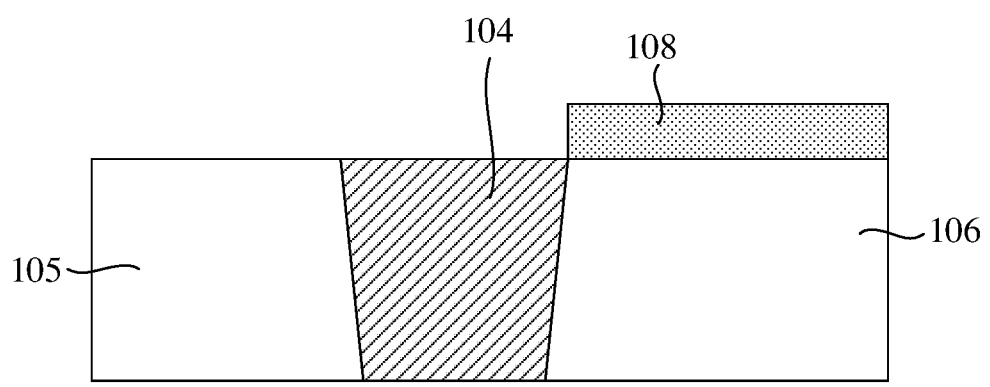

With reference to FIG. 2E, the germanium-silicon substrate 108 on the first substrate 105 and the patterned first mask layer 107 are removed to expose a surface of the first substrate 105. In some embodiments, the removal can be performed through dry etching or wet etching. The gas used in dry etching may be one of trifluoromethane ($CHF_3$), carbon tetrafluoride ($CF_4$), difluoromethane ($CH_2F_2$), hydrobromic acid (HBr), chlorine ($Cl_2$), or sulfur hexafluoride ($SF_6$) or a combination thereof. In wet etching, hot phosphoric acid or hydrofluoric acid can be used as an etching solution.

At S205, a patterned second mask layer is formed on the first substrate on which the isolation structure is formed and the germanium-silicon substrate, in which the patterned second mask layer exposes a surface of the first substrate.

Figure 2F:
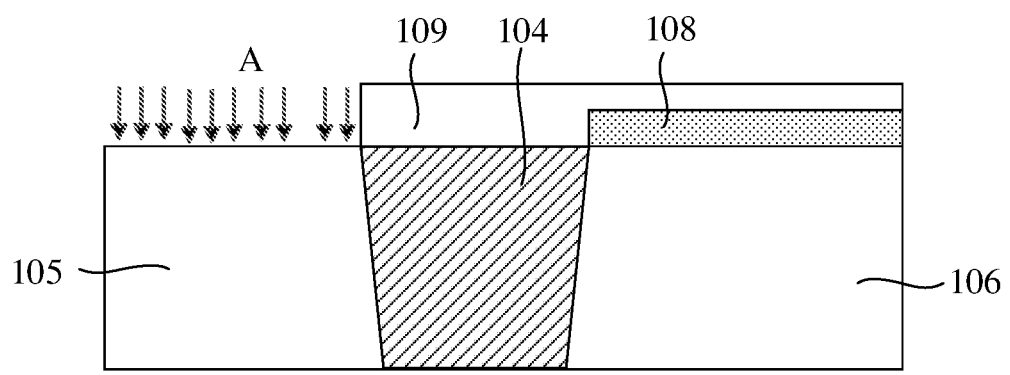

With reference to FIG. 2F, a patterned second mask layer 109 is formed on the first substrate 105 on which the isolation structure 104 is formed and the germanium-silicon substrate 108, in which the patterned second mask layer 109 exposes the surface of the first substrate 105. In some embodiments, the material of the second mask layer may include silicon nitride, silicon carbide, or silicon oxynitride. In addition, the second mask layer can be formed by any of deposition processes such as chemical vapor deposition, physical vapor deposition and atomic layer deposition, and the patterned second mask layer 109 can be formed by photolithography, dry or wet etching.

At S206, first ion implantation is performed on the first substrate by using the patterned second mask layer as a mask, to form the first doped area.

Figure 2G:
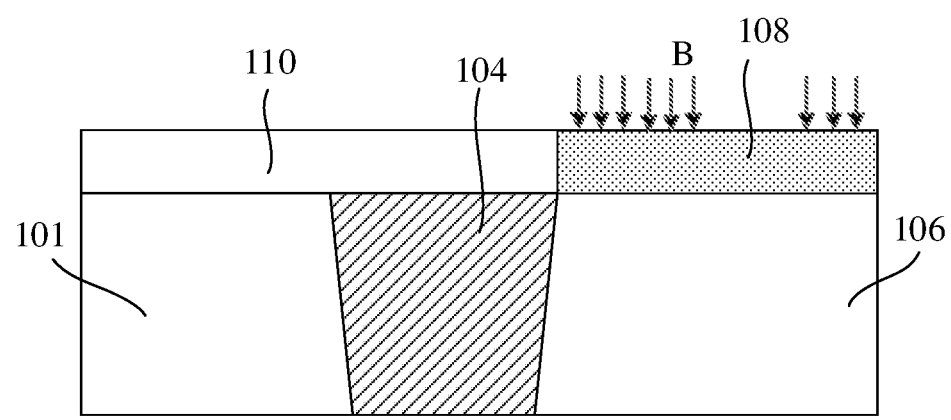

With reference to FIG. 2F and FIG. 2G, first ion implantation is performed on the first substrate 105 by using the patterned second mask layer 109 as a mask, to form the first doped area 101. Arrow A indicates performing first ion implantation on the first substrate 105. In some embodiments, the first doped area 101 may be an N-type doped first substrate, and corresponding implanted first ions may be group VA ions, such as phosphorus, arsenic, and antimony. In some embodiments, ion implantation can also be achieved through processes such as thermal diffusion and plasma doping. After the ion implantation, a high temperature annealing process may also be included to repair lattice damage caused by the ion implantation.

At S207, the patterned second mask layer is removed.

With reference to FIG. 2G, the patterned second mask layer 109 is removed to expose a surface of the germanium-silicon substrate 108. In some embodiments, the patterned second mask layer 109 can be removed through a dry or wet etching process, etc. For an etching solution or gas used, reference may be made to the patterned first mask layer 107, which is not repeated here.

At S208, a patterned third mask layer is formed on the first substrate on which the isolation structure and the first doped area are formed and the germanium-silicon substrate, in which the third mask layer exposes a surface of the germanium-silicon substrate.

With reference to FIG. 2G, a patterned third mask layer 110 is formed on the first substrate 105 on which the isolation structure 104 and the first doped area 101 are formed and the germanium-silicon substrate 108, in which the patterned third mask layer 110 exposes a surface of the germanium-silicon substrate 108. In some embodiments, the material of the third mask layer may include oxide of silicon, oxide of nitrogen or carbide such as silicon oxide, silicon nitride, silicon carbide, or silicon oxynitride. In addition, the third mask layer can be formed by any of deposition processes such as chemical vapor deposition, physical vapor deposition and atomic layer deposition, and the patterned third mask layer 110 can be formed by photolithography, dry or wet etching.

At S209, second ion implantation is performed on the germanium-silicon substrate and the second substrate in contact with a lower surface of the germanium-silicon substrate by using the patterned third mask layer as a mask, to form the second doped area.

Figure 2H:
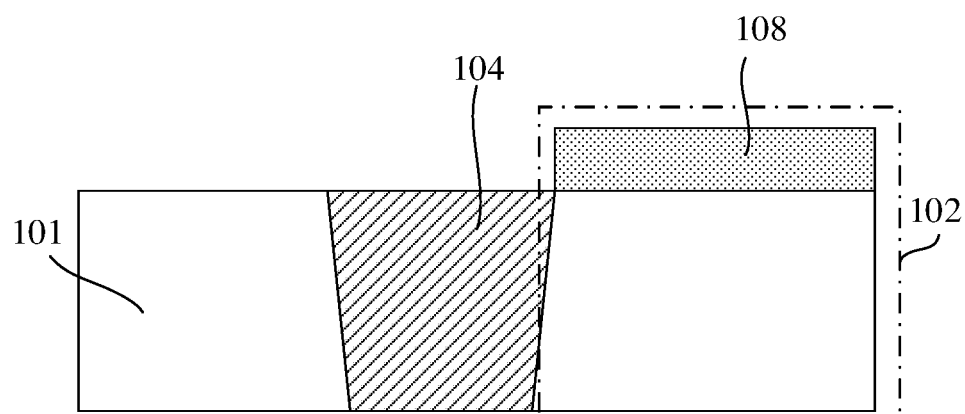

With reference to both FIG. 2G and FIG. 2H, arrow B indicates performing second ion implantation on the second substrate 106 and the germanium-silicon substrate 108. Second ion implantation is performed on the germanium-silicon substrate 108 and the second substrate 106 in contact with a lower surface of the germanium-silicon substrate 108 by using the patterned third mask layer 110 as a mask, to form the second doped area 102. That is, the substrate corresponding to the first doped area may be the first substrate, and the substrate corresponding to the second doped area may be the second substrate and the germanium-silicon substrate formed on the second substrate.

In some embodiments, the second doped area may be a P-type doped second substrate and a P-type doped germanium-silicon substrate, and corresponding implanted second ions may be group IIIA ions such as boron and indium. In some embodiments, an implantation process for the second ions can refer to the first ion implantation process, which is not repeated here. Different doped areas in the embodiments of the disclosure may adopt the same or different ion implantation processes. For example, when the base includes two different doped areas, the first doped area may adopt a thermal diffusion process, and the second doped area may adopt an ion implantation process, which is not limited here.

At S210, the patterned third mask layer is removed.

With reference to FIG. 2H, the patterned third mask layer 110 is removed. In some embodiments, the patterned third mask layer 110 can be removed through a dry or wet etching technology, etc. For an etching solution or gas used, reference may be made to the patterned first mask layer, which is not repeated here.

In some embodiments, N-type ion implantation can also be performed in a P-type doped base, i.e., a formed P well, to form the first doped area 101 to form a PN junction. In addition, P-type ion implantation can also be performed in an N-type doped base, that is, a formed N well, to form the second doped area 102 to form a PN junction.

At S102, nitridation treatment is performed on the first doped area and the second doped area.

Figure 2I:
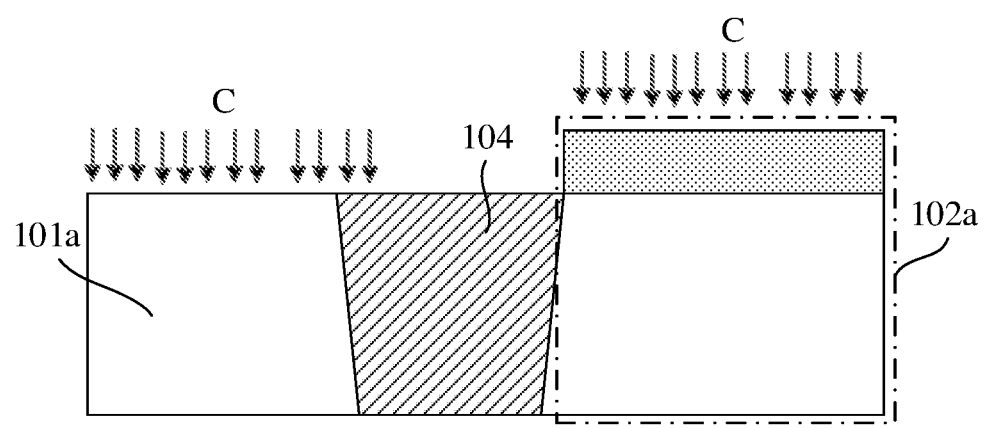

With reference to FIG. 2I, arrow C indicates performing nitridation treatment on the first doped area 101 and the second doped area 102, so that nitrogen ions enter the first doped area 101 and the second doped area 102, to form a first doped area 101a subjected to nitridation treatment and a second doped area 102a subjected to nitridation treatment.

In the embodiments of the disclosure, nitridation treatment may be performed on the first doped area 101 and the second doped area 102 through a plasma nitridation process, rapid thermal nitridation or vertical furnace tube nitridation.

In some embodiments, nitridation treatment may be performed on the first doped area and the second doped area by using a decouple plasma nitridation process. A reaction gas for the nitridation treatment includes nitrogen, and an auxiliary gas for the nitridation treatment includes helium. A ratio of a flow rate of the nitrogen to a flow rate of the helium ranges from 1:5 to 1:2. The flow rate of the helium may be 300 to 500 standard milliliters per minute (sccm), and the flow rate of the nitrogen may be 100 to 300 sccm. In the process of the nitridation treatment, it is ensured that a concentration of the nitrogen is greater than $5 \times 10^{15}$/cubic centimeter ($cm^3$), and the pressure ranges from 5 mtorr to 50 mtorr. The power of the plasma device may range from 300 watts (W) to 1500 W. In this way, ultra-low energy doping can be efficiently realized, which is more conducive to reducing an oxidation rate of the second doped area, and moreover, the problem of interface defects can be alleviated.

In some embodiments, the reaction gas for the nitridation treatment includes nitrogen, and the auxiliary gas for the nitridation treatment includes helium. The ratio of the flow rate of the nitrogen to the flow rate of the helium ranges from 1:5 to 1:2. In this way, the second doped area and the first doped area can have nitrogen ions with sufficient volume concentration, thereby reducing the growth velocity of the second gate oxide layer, and also reducing adverse effects of excessive volume concentration of the nitrogen ions on the electrical properties of a subsequently formed device.

In some embodiments, a reaction temperature for the nitridation treatment ranges from 90 degrees Celsius (° C.) to 100° C., and a reaction time for the nitridation treatment ranges from 90 seconds (s) to 110 s.

The gas flow rate of nitrogen serving as the reaction gas needs to be moderate. If the gas flow rate of nitrogen is too small, the volume concentration of nitrogen ions entering the second doped area is too low, thus the inhibitory effect on the formation of the second gate oxide layer is not significant enough, and it is difficult to reduce the growth velocity of the second gate oxide layer. If the gas flow rate of nitrogen is too large, the volume concentration of nitrogen ions entering the surface of the second doped area is too high, which is likely to adversely affect the electrical properties of the subsequently formed device. Therefore, in this embodiment, the gas flow rate of nitrogen may range from 30 milliliters per minute (ml/min) to 150 ml/min.

In this way, the second doped area and the first doped area can have nitrogen ions with sufficient volume concentration, thereby reducing the growth velocity of the second gate oxide layer, and also reducing adverse effects of excessive volume concentration of nitrogen ions on the electrical properties of a subsequently formed device. In this way, the nitrogen ions enter the first doped area and the second doped area through the nitridation treatment, and the nitrogen ions have an inhibitory effect on the formation of the second gate oxide layer, and reduce the growth velocity of the second gate oxide layer, thereby reducing the difference between the thickness of the first gate oxide layer and the thickness of the second gate oxide layer.

In some embodiments, a high-temperature annealing process may also be included after the nitridation treatment is finished, for stabilizing nitrogen doping and repairing plasma damage in a medium caused by the nitridation treatment.

In the embodiments of the disclosure, the nitridation treatment is performed on the first doped area and the second doped area, and oxidation treatment is performed on the first doped area and the second doped area subjected to the nitridation treatment, to form the first gate oxide layer and the second gate oxide layer respectively. In this way, in the process of nitridation treatment, nitrogen ions doped on the germanium-silicon substrate can prevent formation of Ge—O bond, thereby decreasing a difference between the thickness of the first gate oxide layer and the thickness of the second gate oxide layer, and reducing the effect on the electrical parameters of a semiconductor device, such as threshold voltage and capacitance.

At S103, oxidation treatment is performed on the first doped area and the second doped area subjected to the nitridation treatment, to form a first gate oxide layer and a second gate oxide layer respectively.

Figure 2J:
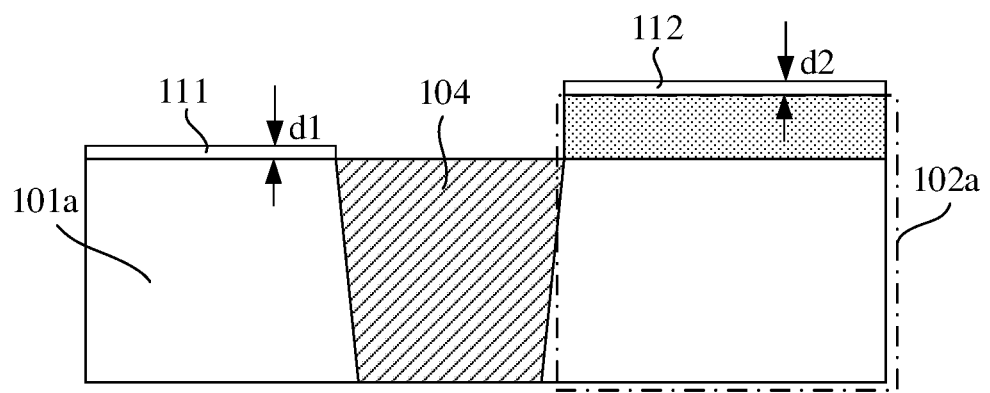

With reference to FIG. 2J, oxidation treatment is performed on the first doped area 101a and the second doped area 102a subjected to the nitridation treatment, to form a first gate oxide layer 111 and a second gate oxide layer 112 respectively.

In the embodiments of the disclosure, the first gate oxide layer and the second gate oxide layer may be silicon oxide. The oxidation treatment may be a suitable oxidation process such as ozone oxidation treatment, thermal oxidation treatment, In-Situ Stream Generation (ISSG) oxidation treatment, wet oxygen oxidation treatment, and high pressure oxidation treatment, which is not limited in the embodiments of the disclosure.

In some embodiments, oxidation treatment may be performed, through ozone oxidation treatment, on the first doped area and the second doped area subjected to the nitridation treatment, to form the first gate oxide layer and the second gate oxide layer respectively. In this way, the oxidation rate can be better controlled, thereby facilitating obtaining a uniform gate oxygen thickness, and providing a better prerequisite for device performance adjustment. In some embodiments, the ozone oxidation may use a wet oxidation process, and an oxidant for the wet oxidation process is ozone. The flow rate of the ozone ranges from 8 to 12 L/min. The temperature for the wet oxidation process ranges from 20° C. to 30° C.

In an embodiment, the first substrate corresponding to the first doped area is a silicon substrate, and the substrate corresponding to the second doped area is a silicon substrate and the germanium-silicon substrate formed on the silicon substrate. Taking this embodiment an example, a reaction of formula (1) occurs when the first gate oxide layer is formed by performing nitridation treatment on the first doped area and using ozone as the oxidant in the wet oxidation process, and a reaction of formula (2) occurs when the second gate oxide layer is formed by performing nitridation treatment on the second doped area and using ozone as the oxidant in the wet oxidation process.

$$Si \rightarrow SiN_x + O_3 + DIW \rightarrow SiON_x \quad (1)$$

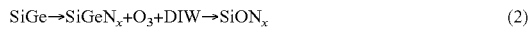

$$SiGe \rightarrow SiGeN_x + O_3 + DIW \rightarrow SiON_x \quad (2)$$

Formula (1) includes two arrows, the first arrow indicates a process of performing nitridation treatment on the silicon substrate to generate $SiN_x$, and the second arrow indicates performing ozone oxidation treatment on the silicon substrate in which $SiN_x$ has been generated. During the ozone oxidation treatment, an appropriate amount of Deionized Water (DIW) is added, and $SiN_x$ reacts with ozone and DIW to generate $SiON_x$. Formula (2) also includes two arrows, the first arrow indicates a process of performing nitridation treatment on the germanium-silicon substrate in the second doped area to generate $SiGeN_x$, and the second arrow indicates performing ozone oxidation treatment on the germanium-silicon substrate in which $SiGeN_x$ has been generated. An appropriate amount of deionized water is also added. In the process of the ozone oxidation treatment, N ions inhibit the formation of Ge—O bonds, and $SiGeN_x$ reacts with ozone and DIW to generate $SiON_x$, thereby reducing the rate of generating the second gate oxide layer. That is, when gate oxide layers are formed by performing nitridation treatment on the first doped area and the second doped area and using ozone as an oxidant in the wet oxidation process, the gate oxide layers formed on the first doped area and the second doped area are the same, for example, both may be $SiON_x$, thereby reducing the difference between the thickness of the first gate oxide layer and the thickness of the second gate oxide layer, and improving the consistency of the gate oxide thicknesses of the first doped area and the second doped area. Furthermore, by introducing ozone into deionized water, the ozone concentration can be saturated to ensure the stability of the concentration, thereby facilitating further improving the uniformity of the thickness of the gate oxide layer formed.

In some embodiments, a thickness of the first gate oxide layer may range from 10.5 angstroms to 11 angstroms (Å), a thickness of the second gate oxide layer may be greater than the thickness of the first gate oxide layer, and a difference between the thickness of the second gate oxide layer and the thickness of the first gate oxide layer may be less than 1.5 Å. With reference to FIG. 2J, that is, d1 ranges from 10.5 Å to 11 Å, and a difference between d2 and d1 is less than 1.5 Å.

In some embodiments, oxidation treatment can also be performed, through an ISSG process, on the first doped area and the second doped area subjected to the nitridation treatment, to form the first gate oxide layer and the second gate oxide layer respectively. In this way, the first gate oxide layer and the second gate oxide layer having advantages of good coverage capability, good uniformity and good compactness can be formed, which is beneficial to improve the performance of the device and ameliorate the problem of device mismatch. In some embodiments, the reaction gas for the ISSG process may be oxygen and hydrogen, and the reaction temperature for the ISSG process may range from 850° C. to 950° C. ISSG treatment is performed on the first doped area and the second doped area subjected to the nitridation treatment for 15 s to 20 s, to form the first gate oxide layer and the second gate oxide layer respectively.

In some embodiments, the reaction gas for the ISSG process may further include one of a mixed gas of $N_2O$ and $H_2$ or a mixed gas of $N_2O$, $O_2$ and $H_2$.

Figure 3A:
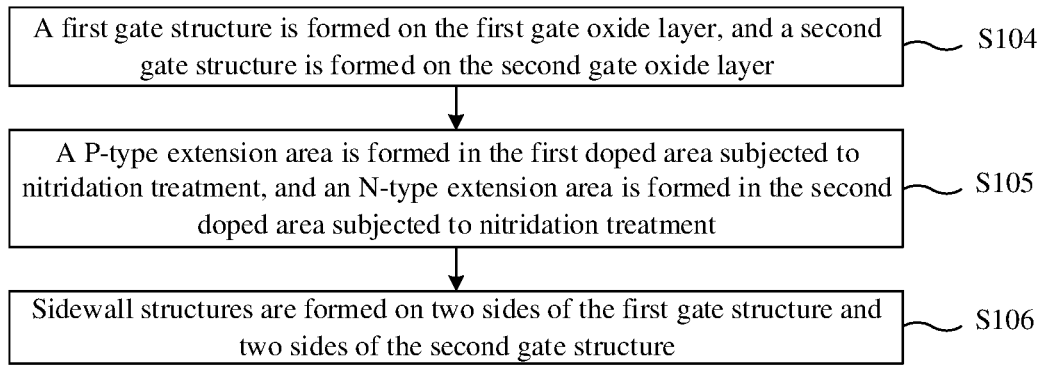
FIG. 3A is a schematic flowchart of a method for forming a semiconductor structure according to an embodiment of the disclosure.

In some embodiments, after S103, the method may further include S104 to S106. With reference to FIG. 3A, S104 to S106 are explained below in conjunction with FIG. 3B to FIG. 3E.

At S104, a first gate structure is formed on the first gate oxide layer, and a second gate structure is formed on the second gate oxide layer.

Figure 3B:
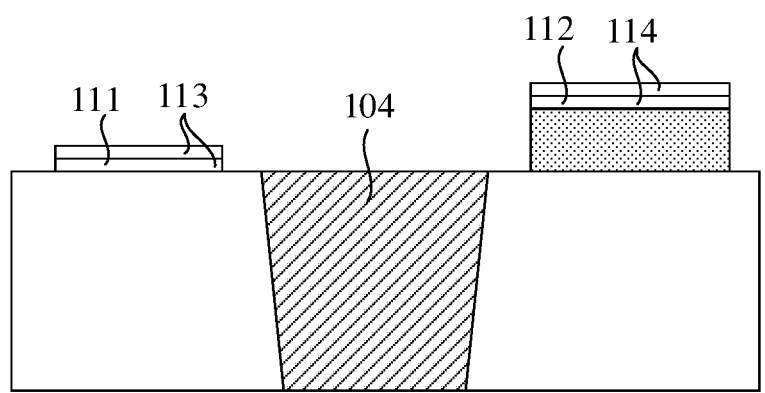
FIG. 3B to FIG. 3E are schematic diagrams of a process for forming a semiconductor structure according to an embodiment of the disclosure.

With reference to FIG. 3B, a first gate structure 113 is formed on the first gate oxide layer 111, and a second gate structure 114 is formed on the second gate oxide layer 112.

In some embodiments, the first gate structure includes a first gate oxide layer, a first high-k dielectric layer, a first work function layer, a first cover layer, and a polysilicon layer. The second gate structure includes a second gate oxide layer, a second high-k dielectric layer, a second work function layer, a second cover layer, and a polysilicon layer. Correspondingly, the operation of forming the first gate structure and the second gate structure may include the following operations.

At S1041, a first high-k dielectric layer, a first work function layer, and a first cover layer are successively deposited on the first gate oxide layer to form a first stack structure.

Figure 3C:
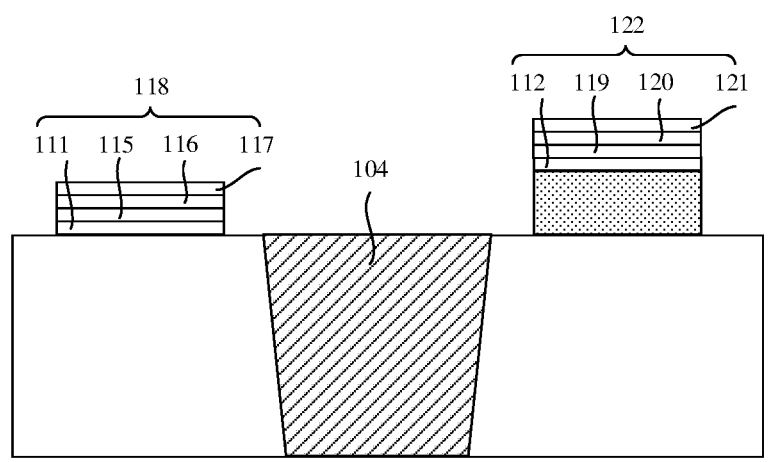

With reference to FIG. 3C, a first high-k dielectric layer 115, a first work function layer 116, and a first cover layer 117 are successively deposited on the first gate oxide layer 111 to form a first stack structure 118.

In the embodiments of the disclosure, the first high-k dielectric layer may be formed through a CVD, PVD or ALD process, etc. The first high-k dielectric layer may include at least one of a hafnium silicon oxide (HfSiO) layer, a hafnium silicon oxynitride (HfSiON) layer, a hafnium tantalum oxide (HfTaO) layer, a hafnium titanium oxide (HfTiO) layer, a hafnium zirconium oxide (HfZrO) layer, a zirconium oxide ($ZrO_2$) layer or an aluminum oxide ($Al_2O_3$) layer. The first work function layer may include a lanthanum sesquioxide ($La_2O_3$) layer, and may be configured to adjust a threshold voltage. The first cover layer may be a metal layer such as a titanium nitride (TiN) layer or a tantalum nitride (TaN) layer, and can improve polysilicon depletion.

At S1042, a second high-k dielectric layer, a second work function layer, and a second cover layer are successively deposited on the second gate oxide layer to form a second stack structure.

With reference to FIG. 3C, a second high-k dielectric layer 119, a second work function layer 120, and a second cover layer 121 are successively deposited on the second gate oxide layer 112 to form a second stack structure 122.

During implementation, the second high-k dielectric layer may be the same as or different from the first high-k dielectric layer. The second work function layer may include an aluminum sesquioxide ($Al_2O_3$) layer, and may be configured to adjust the threshold voltage. The second cover layer may be the same as or different from the first cover layer.

At S1043, a polysilicon layer is formed on the first stack structure and the second stack structure to form the first gate structure and the second gate structure.

Figure 3D:
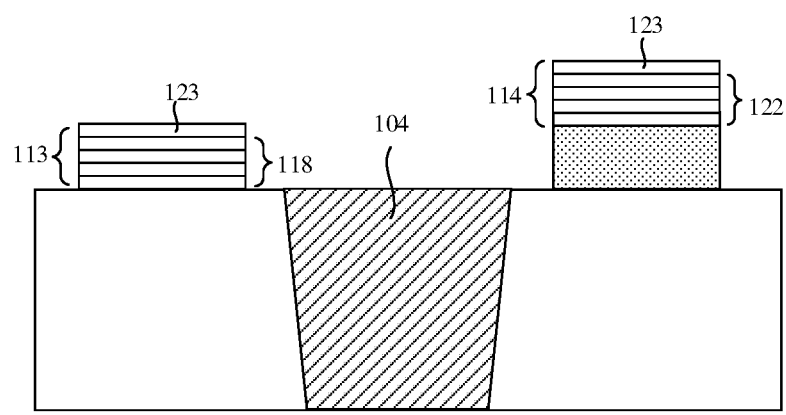

With reference to FIG. 3D, a polysilicon layer 123 is formed on the first stack structure 118 and the second stack structure 122 to form the first gate structure 113 and the second gate structure 114.

At S105, a P-type extension area is formed in the first doped area subjected to nitridation treatment, and an N-type extension area is formed in the second doped area subjected to nitridation treatment.

Figure 3E:
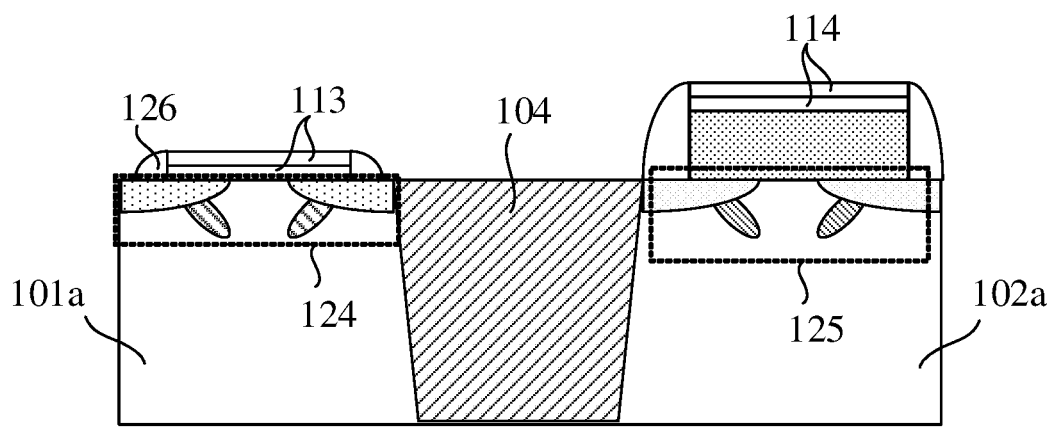

With reference to FIG. 3E, a P-type extension area 124 is formed in the first doped area 101a subjected to nitridation treatment, and an N-type extension area 125 is formed in the second doped area 102a subjected to nitridation treatment.

Here, the N-type extension area includes halo ion implantation and Lightly Doped Drain (LDD), the P-type extension area also includes halo ion implantation and LDD, and the difference lies in that the doped ions of the N-type extension area are different from the doped ions of the P-type extension area. During implementation, during the halo ion implantation, the ion implantation direction may not be perpendicular to the first doped area and the second doped area, but may have a certain angle to form a bag-like doped area. In this way, lateral extension of depletion areas of a source and a drain can be reduced, to avoid a source/drain punch-through phenomenon. The extension areas form an impurity concentration gradient between the source/drain and a channel, thereby reducing a peak electric field near the drain and improving the hot carrier effect.

At S106, sidewall structures are formed on two sides of the first gate structure and two sides of the second gate structure.

With reference to FIG. 3E, sidewall structures 126 are formed on two sides of the first gate structure 113 and two sides of the second gate structure 114. The material of the sidewall structures 126 may be nitride, such as silicon nitride or silicon oxynitride.

In embodiments of the disclosure, a method for forming a semiconductor structure includes: a base is provided, in which the base includes a first doped area and a second doped area, and an isolation structure is provided between the first doped area and the second doped area; nitridation treatment is performed on the first doped area and the second doped area; and oxidation treatment is performed on the first doped area and the second doped area subjected to the nitridation treatment, to form a first gate oxide layer and a second gate oxide layer respectively. In this way, by performing nitridation treatment on the first doped area and the second doped area, and performing oxidation treatment on the first doped area and the second doped area subjected to the nitridation treatment, a first gate oxide layer and a second gate oxide layer are formed respectively. In this way, on the one hand, the nitrogen ions formed by the nitridation treatment may reduce the oxidation rate of the second doped area, thereby inhibiting the formation of the second gate oxide layer. Therefore, the difference between the thickness of the first gate oxide layer and the thickness of the second gate oxide layer can be reduced, to reduce the effect on the electrical parameters of the semiconductor device, such as threshold voltage and capacitance, and provide a good basis for adjusting the semiconductor device. On the other hand, the process flow of the method is simple and controllable.

The embodiments of the disclosure provide a semiconductor structure, and the semiconductor structure is formed by the method in the foregoing embodiments.

The features disclosed in the method or semiconductor structure embodiments provided in the disclosure may be combined arbitrarily without conflict to obtain new method embodiments or semiconductor structure embodiments.

The descriptions of the semiconductor structure embodiments above are similar to the descriptions of the method embodiments above, and have similar beneficial effects to the method embodiments. For technical details not disclosed in the semiconductor embodiments of the disclosure, please refer to the descriptions of the method embodiments of the disclosure for understanding.

The foregoing descriptions are merely exemplary embodiments of the disclosure, and are not intended to limit the scope of protection of the disclosure. Any modification, equivalent replacement, improvement and the like made within the spirit and principle of the disclosure shall fall within the scope of protection of the disclosure. Therefore, the scope of protection of the disclosure shall be subject to the scope of protection of the claims.

The invention claimed is:
1. A method for forming a semiconductor structure, comprising:

providing a base, wherein the base comprises a first doped area and a second doped area, and an isolation structure is provided between the first doped area and the second doped area;

performing nitridation treatment on the first doped area and the second doped area; and performing oxidation treatment on the first doped area and the second doped area subjected to the nitridation treatment, to form a first gate oxide layer and a second gate oxide layer respectively, wherein providing the base comprises:

providing a substrate;

forming the isolation structure on the substrate; and doping the substrate on which the isolation structure is formed, to form the first doped area on one side of the isolation structure and to form the second doped area on another side of the isolation structure, wherein the substrate corresponding to the first doped area is a first substrate, and the substrate corresponding to the second doped area is a second substrate and a germanium-silicon substrate is formed on the second substrate, wherein forming the germanium-silicon substrate on the second substrate comprises:

forming a patterned first mask layer on the first substrate and the second substrate, wherein the patterned first mask layer exposes a surface of the second substrate;

forming the germanium-silicon substrate on the surface of the second substrate through epitaxial growth or deposition; and removing the germanium-silicon substrate on the first substrate and the patterned first mask layer.

2. The method of claim 1, wherein doping the substrate on which the isolation structure is formed, to form the first doped area on one side of the isolation structure and to form the second doped area on another side of the isolation structure comprises:

forming a patterned second mask layer on the first substrate on which the isolation structure is formed and the germanium-silicon substrate, wherein the patterned second mask layer exposes a surface of the first substrate;

performing first ion implantation on the first substrate by using the patterned second mask layer as a mask, to form the first doped area;

removing the patterned second mask layer;

forming a patterned third mask layer on the first substrate on which the isolation structure and the first doped area are formed and the germanium-silicon substrate, wherein the patterned third mask layer exposes a surface of the germanium-silicon substrate;

performing second ion implantation on the germanium-silicon substrate and the second substrate in contact with a lower surface of the germanium-silicon substrate by using the patterned third mask layer as a mask, to form the second doped area; and removing the patterned third mask layer.

3. The method of claim 2, wherein the first doped area comprises an N-type doped first substrate, and the second doped area comprises a P-type doped second substrate and a P-type doped germanium-silicon substrate.

4. The method of claim 1, wherein performing nitridation treatment on the first doped area and the second doped area comprises:

performing the nitridation treatment on the first doped area and the second doped area through plasma.

5. The method of claim 4, wherein a reaction gas for the nitridation treatment comprises nitrogen, an auxiliary gas for the nitridation treatment comprises helium, and a ratio of a flow rate of the nitrogen to a flow rate of the helium ranges from 1:5 to 1:2.

6. The method of claim 5, wherein a reaction temperature for the nitridation treatment ranges from 90° C. to 100° C., and a reaction time for the nitridation treatment ranges from 90 s to 110 s.

7. The method of claim 1, wherein the oxidation treatment is ozone oxidation.

8. The method of claim 7, wherein the ozone oxidation uses a wet oxidation process, and an oxidant for the wet oxidation process is ozone.

9. The method of claim 8, wherein a flow rate of the ozone in the wet oxidation process ranges from 8 L/min to 12 L/min.

10. The method of claim 8, wherein a temperature for the wet oxidation process ranges from 20° C. to 30° C.

11. The method of claim 1, wherein a thickness of the first gate oxide layer ranges from 10.5 Å to 11 Å, a thickness of the second gate oxide layer is greater than the thickness of the first gate oxide layer, and a difference between the thickness of the second gate oxide layer and the thickness of the first gate oxide layer is less than 1.5 Å.

* * * * *